(12) United States Patent
Hung et al.

(10) Patent No.: US 7,585,790 B2
(45) Date of Patent: Sep. 8, 2009

(54) METHOD FOR FORMING SEMICONDUCTOR DEVICE

(75) Inventors: Wen-Han Hung, Kaohsiung (TW);
Cheng-Tung Huang, Kaohsiung (TW);
Kun-Hsien Lee, Tainan (TW);
Shyh-Fann Ting, Kaohsiung County (TW); Li-Shian Jeng, Taitung (TW);
Tzyy-Ming Cheng, Hsinchu (TW);
Chia-Wen Liang, Hsinchu (TW);
Neng-Kuo Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 243 days.

(21) Appl. No.: 11/459,008

(22) Filed: Jul. 20, 2006

(65) Prior Publication Data
US 2008/0020588 A1    Jan. 24, 2008

(51) Int. Cl.
*H01L 21/31* (2006.01)
*H01L 21/469* (2006.01)

(52) U.S. Cl. ........................ 438/791; 438/793; 438/799; 257/E21.633; 257/E21.328

(58) Field of Classification Search ............... 438/791, 438/792, 793, 799; 257/E21.328, E21.347, 257/E21.478, E21.489, E21.493, E21.576, 257/E21.633
See application file for complete search history.

(56) References Cited

U.S. PATENT DOCUMENTS

| 6,930,007 | B2 |  | 8/2005 | Bu et al. |
| 7,214,629 | B1 | * | 5/2007 | Luo et al. ................... 438/778 |
| 2004/0209432 | A1 | * | 10/2004 | Ku et al. ..................... 438/301 |
| 2005/0059228 | A1 |  | 3/2005 | Bu et al. |
| 2005/0260810 | A1 | * | 11/2005 | Cheng et al. ................. 438/199 |
| 2006/0099745 | A1 | * | 5/2006 | Hsu et al. ..................... 438/149 |
| 2006/0269692 | A1 | * | 11/2006 | Balseanu et al. ............ 427/569 |
| 2007/0099369 | A1 | * | 5/2007 | Ning ............................. 438/199 |
| 2007/0128783 | A1 | * | 6/2007 | Ting et al. ................... 438/199 |

* cited by examiner

*Primary Examiner*—Caridad M Everhart
(74) *Attorney, Agent, or Firm*—Jianq Chyun IP Office

(57) ABSTRACT

A method of forming a semiconductor device. The method comprises steps of providing a substrate having a first transistor, a second transistor and non-salicide device formed thereon and the conductive type of the first transistor is different from that of the second transistor. A buffer layer is formed over the substrate and a tensile material layer is formed over the buffer layer. A portion of the tensile material layer over the second transistor is thinned and a spike annealing process is performed. The tensile material layer is removed to expose the buffer layer over the substrate and a patterned salicide blocking layer is formed over the non-salicide device. A salicide process is performed for forming a salicide layer on a portion of the first transistor and the second transistor.

17 Claims, 3 Drawing Sheets

METHOD FOR FORMING SEMICONDUCTOR DEVICE

BACKGROUND OF THE INVENTION

1. Field of Invention

The present invention relates to a method for forming a semiconductor device. More particularly, the present invention relates to a method for increasing the carrier mobility of the semiconductor device.

2. Description of Related Art

The metal-oxide semiconductor (MOS) transistor having low electrical consumption is appropriate for the high density integration process. Therefore, a MOS transistor is the most widely applied in basic electronic devices. As the integration of semiconductor devices continues to increase, the dimension of the MOS transistor reduces correspondingly. However, any further size reduction is limited. Therefore, other approaches, for example, by increasing the strain of the transistor's channel to improve the carrier mobility, are currently being evaluated.

For an N-type metal oxide semiconductor transistor, forming a silicon nitride layer having a tensile stress on the N-type MOS transistor is a common method used in increasing the strain of the channel. Further, the increase of the electron mobility is directly proportional to the stress of the silicon nitride film. Accordingly, the stress of the silicon nitride film can be used to control the increase of the electron mobility of the N-type MOS transistor. The higher the stress of the silicon nitride film, the better the electron mobility is resulted.

On the other hand, for a P-type MOS transistor, the higher the tensile stress of the silicon nitride film, the hole mobility decays correspondingly. In order to form both of the P-type MOS transistor and the N-type MOS transistor, the conventional method is to remove a portion of the silicon nitride layer over the P-type MOS transistor and then to remove the rest of the silicon nitride layer over the N-type MOS transistor after the strain of the channel of the N-type MOS transistor is increased. However, in the two-step silicon nitride removal process, the silicon nitride residue or the over etching issue easily happen at the interface between the P-type MOS transistor and the N-type MOS transistor.

FIG. 1 is a cross-sectional view showing a conventional semiconductor device. FIG. 2 is a cross-sectional view showing another conventional semiconductor device. As shown in FIG. 1, during the silicon nitride layer over the N-type MOS transistor 102a is removed and the pattern mask layer over the P-type MOS transistor 102b overlaps a portion of the silicon nitride layer, some of the silicon nitride layer 104 still remains on the substrate 100. On the other hand, as shown in FIG. 2, during the silicon nitride layer over the N-type MOS transistor 202a is removed and the pattern mask layer over the P-type MOS transistor 202b draws back toward to the P-type MOS transistor 202b so as to expose a portion of the isolation structure or the substrate 200, an over etching issue happens. That is, the isolation structure or the substrate 200 is damaged to form the crack 204 therein during the silicon nitride layer is removed. Accordingly, the performance of the semiconductor device is degraded and the yield is decreased.

SUMMARY OF THE INVENTION

The present invention is to provide a method for forming a semiconductor device capable of avoiding the silicon nitride residue at the interface between the P-type transistor and the N-type transistor.

The present invention is to provide a method for forming a semiconductor device capable of avoiding the over etching issue happening at the interface between the P-type transistor and the N-type transistor.

To achieve these and other advantages and in accordance with the purpose of the invention, as embodied and broadly described herein, the invention provides a method of forming a semiconductor device. The method comprises steps of providing a substrate having a first transistor, a second transistor and non-salicide device formed thereon and the conductive type of the first transistor is different from that of the second transistor. A buffer layer is formed over the substrate and a tensile material layer is formed over the buffer layer. A portion of the tensile material layer over the second transistor is thinned and a spike annealing process is performed. The tensile material layer is removed to expose the buffer layer over the substrate and a patterned salicide blocking layer is formed over the non-salicide device. A salicide process is performed for forming a salicide layer on a portion of the first transistor and the second transistor.

According to one embodiment of the present invention, the conductive type of the first transistor is N type and the conductive type of the second transistor is P type.

According to one embodiment of the present invention, after the step for thinning the portion of the tensile material layer over the second transistor, the thickness of the portion of the tensile material layer over the second transistor is about 0~200 angstroms.

According to one embodiment of the present invention, the tensile material layer formed over the buffer layer before the step of thinning the portion of the tensile material layer over the second transistor has a thickness of about 300~1000 angstroms.

According to one embodiment of the present invention, the method for removing the tensile material layer includes a wet etching process.

According to one embodiment of the present invention, the temperature of the spike annealing process is about 1000~1200° C.

According to one embodiment of the present invention, the buffer layer is made of silicon oxide.

According to one embodiment of the present invention, the thickness of the buffer layer is about 50~100 angstroms.

According to one embodiment of the present invention, the tensile material layer is made of silicon nitride.

According to one embodiment of the present invention, the material of the patterned salicide blocking layer includes silicon oxide and silicon nitride.

The present invention further provides a method for forming a semiconductor device. The method comprises steps of providing a substrate having an N-type transistor, a P-type transistor and a non-salicide device formed thereon. A liner oxide layer is formed over the substrate and a silicon nitride layer is formed over the liner oxide layer. A patterned mask layer is formed over the silicon nitride layer to expose a portion of the silicon nitride layer over the P-type transistor and a portion of the exposed silicon nitride layer is removed so that the thickness of the remaining portion of the exposed silicon nitride layer is about 0~200 angstroms. The patterned mask layer is removed and a thermal process is performed. A wet etching process is performed to remove the silicon nitride layer so as to expose the liner oxide layer. A salicide blocking layer is formed over the non-salicide device to expose the N-type transistor and the P-type transistor and a salicide process is performed for forming a salicide layer on a portion of the N-type transistor and the P-type transistor.

According to one embodiment of the present invention, the thickness of the silicon nitride layer before the step of removing the portion of the exposed silicon nitride layer is about 300~1000 angstroms.

According to one embodiment of the present invention, the thickness of the liner oxide layer is about 50~100 angstroms.

According to one embodiment of the present invention, the salicide blocking layer is made of silicon nitride.

According to one embodiment of the present invention, the salicide blocking layer is made of silicon oxide.

According to one embodiment of the present invention, the temperature of the thermal process is about 1000~1200° C.

According to one embodiment of the present invention, the thermal process includes a spike annealing process.

In the present invention, since the tensile material layer is entirely removed after the thermal process/spike annealing process is performed, the conventional tensile material layer residue or the over etching issue can be avoided. Moreover, the thin tensile material layer over the P-type transistor can protect the underlayer buffer layer/liner oxide layer from being over etched during the thinning process of the tensile material layer over the P-type transistor.

In order to make the aforementioned and other objects, features and advantages of the present invention comprehensible, a preferred embodiment accompanied with figures is described in detail below.

DESCRIPTION OF EMBODIMENTS

FIGS. 3A through 3E are cross-sectional views showing a method for forming a semiconductor device according to one embodiment of the present invention.

Figure 1:
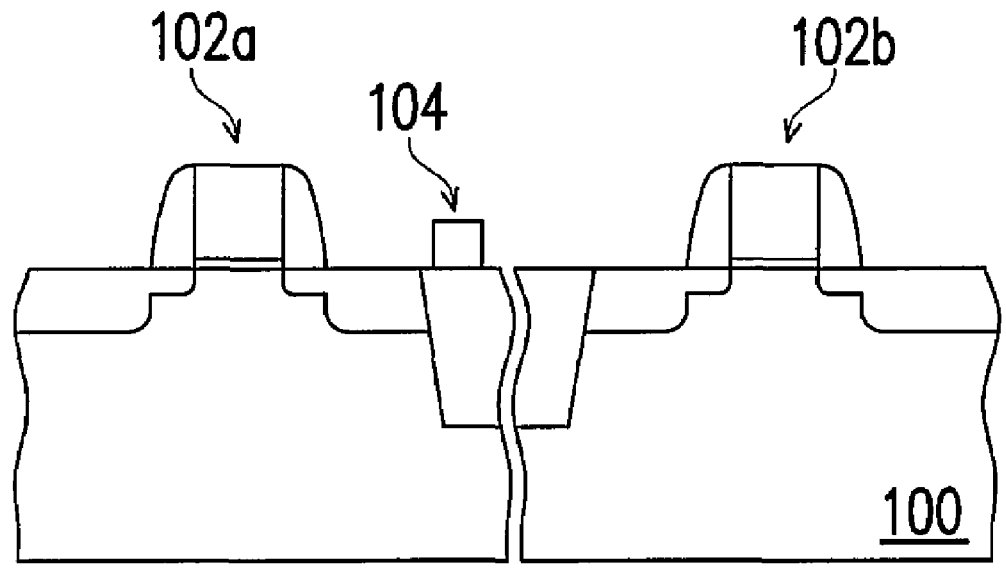
FIG. 1 is a cross-sectional view showing a conventional semiconductor device.
Figure 2:
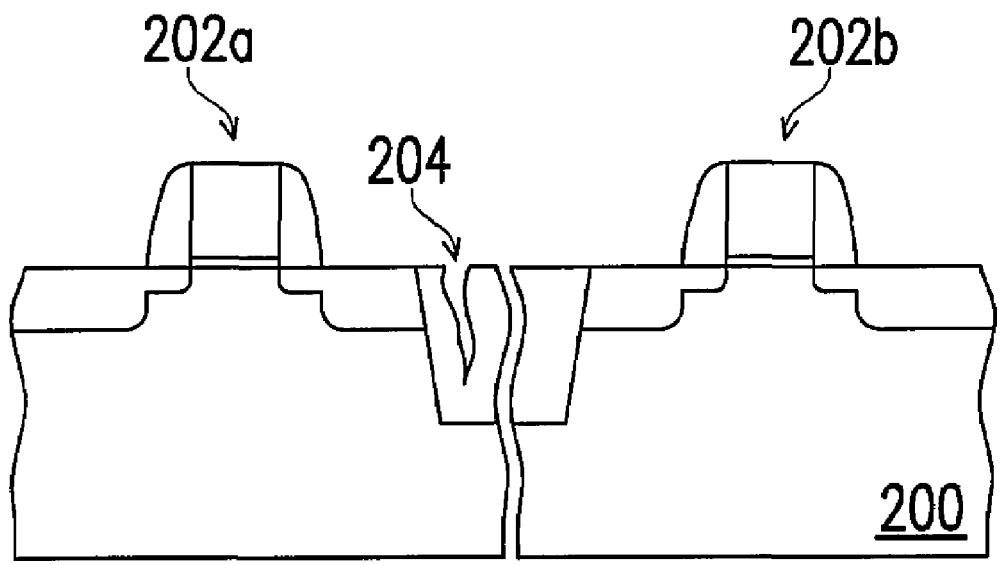
FIG. 2 is a cross-sectional view showing a conventional semiconductor device.
Figure 3A:
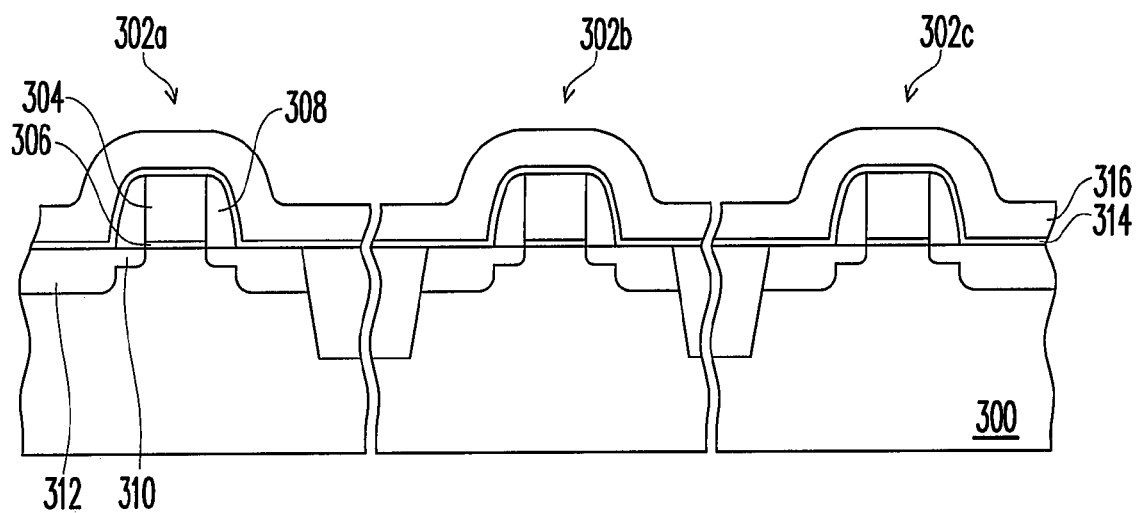
FIGS. 3A through 3E are cross-sectional views showing a method for forming a semiconductor device according to one embodiment of the present invention.

As shown in FIG. 3A, a substrate 300 is provided. The substrate 300 can be a silicon substrate and has at least one transistor 302a with a first conductive type, one transistor 302b with a second conductive type and a non-salicide device 302c. The first conductive type can be, for example, the N type and the second conductive type can be, for example, the P type. Further, the so-called non-salicide device 302c is the device without having any salicide layer formed on the components of the device in the later performed processes. Each of the transistor 302a and the transistor 302b has a gate 304, a gate dielectric layer 306, a spacer 308, a lightly-doped drain (LDD) region 310 and a source/drain region 312. The gate 304 is located on the substrate 300 and the gate dielectric layer 306 is located between the gate 304 and the substrate 300. In addition, the spacer 308 is disposed on the sidewall of the gate structure composed of the gate 304 and the gate dielectric layer 306. Also, the LDD region 310 is located in the substrate 300 under the spacer 308 and the source/drain region 312 is located in the substrate adjacent to the LDD region 310.

As shown in FIG. 3A, a buffer layer 314 is formed over the substrate 300 so as to cover the transistors 302a and 302b and the non-salicide device 302c. The buffer layer 314 can be, for example, made of silicon oxide. Preferably, the buffer layer can be, for example, a liner oxide layer formed by a thermal process. In addition, the thickness of the buffer layer is about 50~100 angstroms. Thereafter, a tensile material layer 316 is formed on the buffer layer 314 over the substrate 300. The tensile material layer 316 can be, for example but not limited to, made from silicon nitride by a chemical vapor deposition. The thickness of the tensile material layer 316 is about 300~1000 angstroms.

Figure 3B:
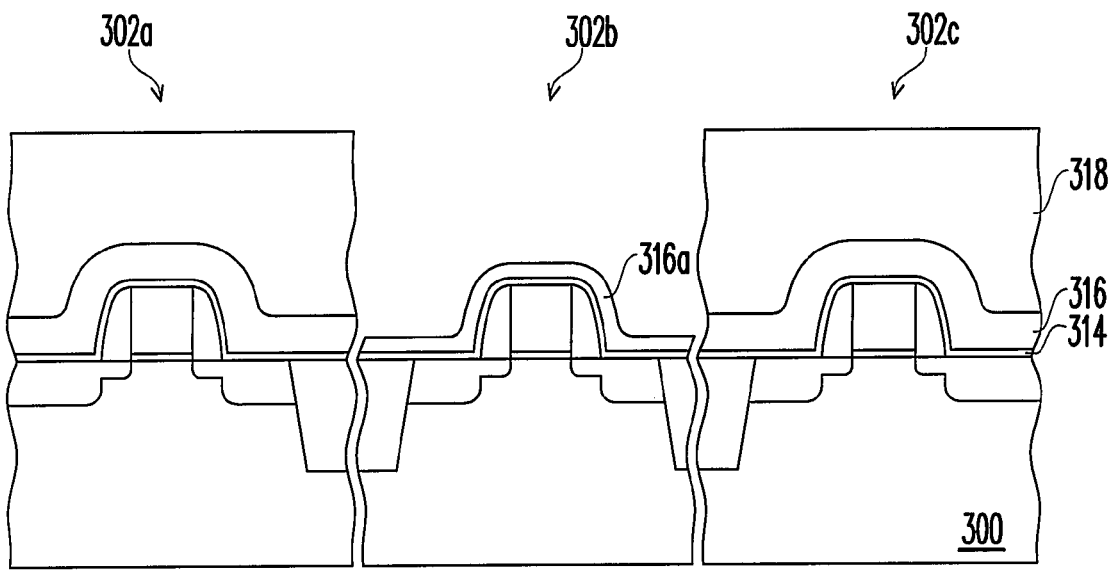

As shown in FIG. 3B, a patterned mask layer 318 is formed over the substrate 300. The patterned mask layer 318 covers the transistor 302a and the non-salicide device 302c but exposes a portion of the tensile material layer 316 over the transistor 302b. The patterned mask layer 318 can be, for example, a photoresist layer. Next, a portion of the tensile material layer 316 over the transistor 302b is removed so that the portion of the tensile material layer 316 over the transistor 302b is transformed into a tensile material layer 316a. That is, the portion of the tensile material layer 316 over the transistor 302b is thinned to be the tensile material layer 316a. Therefore, the thickness of the tensile material layer 316a is smaller than that of the tensile material layer 316. The thickness of the tensile material layer 316a is about 0~200 angstroms. The method for thinning the portion of the tensile material layer 316 over the transistor 302b can be, for example, a dry etching process. Preferably, the method for thinning the portion of the tensile material layer 316 over the transistor 302b can be, for example, an anisotropic etching process. The thin tensile material layer 316a covering the transistor 302b is used to protect the underlayer buffer layer 314 from being over etched.

Figure 3C:
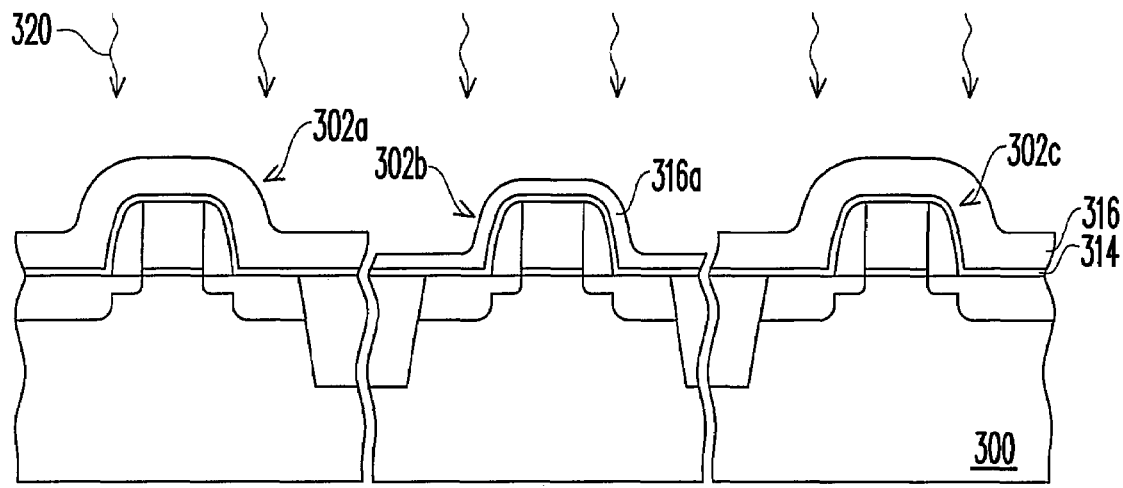

As shown in FIG. 3C, the patterned mask layer 318 is removed. A mobility enhancement process 320 is performed to improve the stress train of the channel of the transistor 302a. The mobility enhancement process 320 can be, for example, a thermal process. Preferably, the thermal process comprises a spike annealing process. The temperature for performing the mobility enhancement process 320 is about 1000~1200° C.

Figure 3D:
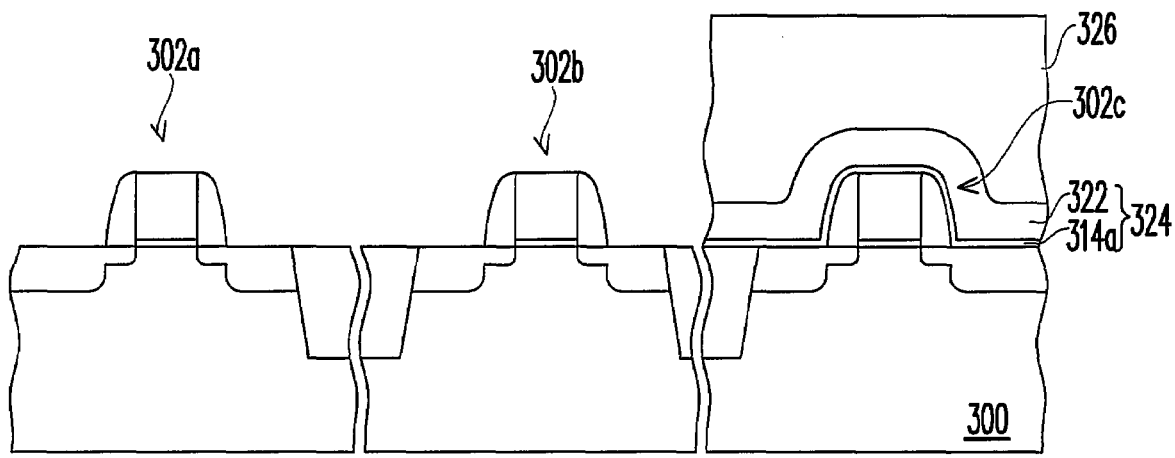

As shown in FIG. 3D, a salicide block layer 324 is formed over the substrate 300 to cover the non-salicide device 302c. The method for forming the salicide block layer 324 comprises steps of removing the tensile material layer 316 including the thin tensile material layer 316a to expose the buffer layer 314. Then, a material layer (not shown) is formed on the buffer layer 314 and a patterned mask layer 326 is formed over the substrate 300 to cover the non-salicide device 302c. Furthermore, the patterned mask layer 326 exposes a portion of the material layer over the transistors 302a and 302b. Thus, the expose portion of the material layer and the underlayer buffer layer 314 are removed to expose the transistors 302a and 302b. Therefore, the material layer is converted into a material layer 322 over the non-salicide device 302c and the buffer layer 314 is converted into a buffer layer 314a as well. Accordingly, the material layer 322 and the buffer layer 314a together form the salicide blocking layer 324 for prevent the non-salicide device 302 from being affected by the later performed salicide process. The method for removing the tensile material layer 316 including the thin tensile material layer 316a entirely can be, for example but not limited to, a wet etching process. In the wet etching process mentioned above, the buffer layer 314 can be a shelter layer for protecting the transistors 302a and 302b and the non-salicide device 302c from being damaged by the wet etching solvent. In addition, the material of the material layer 322 can be, for example but not limited to, silicon nitride or silicon oxide. The thickness of the material layer 322 is about 300~1000 angstroms. Furthermore, the material of the patterned mask layer 326 can be, for example but not limited to, photoresist.

Figure 3E:
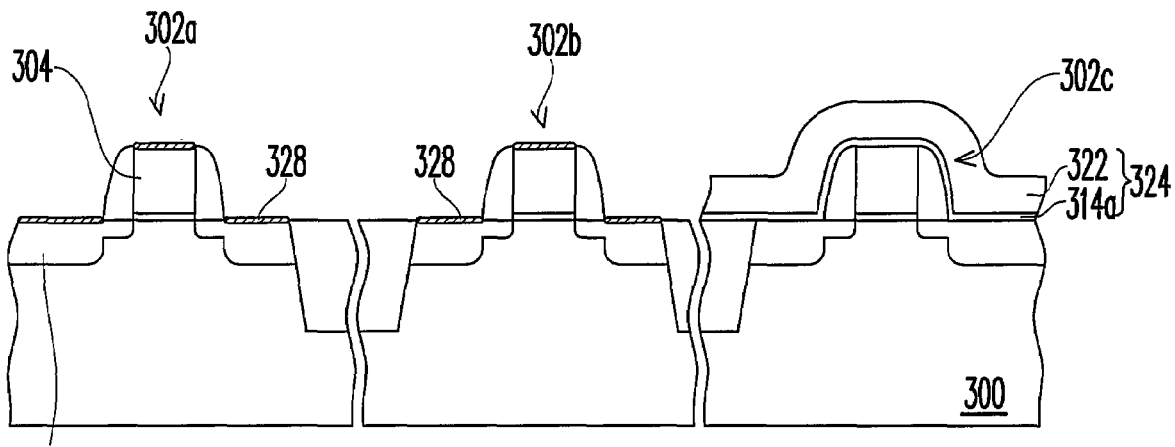

As shown in FIG. 3E, a salicide process is performed for forming a salicide layer 328 on a portion of the transistors 302a and 302b. For example, as shown in FIG. 3E, the salicide layer is formed on the top of the gates 304 of the transistors 302a and 302b and on the top surface of the source/drain regions 312 of the transistors 302a and 302b.

In the present invention, since a portion of the tensile material layer 316 over the transistor 302b is thinned, the hole mobility of the transistor 302b is not influenced by the later performed mobility enhancement process. Moreover, the thin tensile material layer 316a over the transistor 302b can protect the underlayer buffer layer from being over etched during the thinning process of the tensile material layer 316 over the transistor 302b. Furthermore, because the tensile material layer 316 is entirely removed and then the salicide blocking layer 324 is formed in the later process step, the tensile material layer residue or the over etching happening at the interface between the transistors 302a and 302b can be overcome. In addition, since the buffer layer 314 is located under the tensile material layer 316, the buffer layer 314 can protect the transistors 302a and 302b and the non-salicide device 302c from being affected by the wet etching process for entirely removing the tensile material layer 316.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor device, comprising:
    providing a substrate having a first transistor, a second transistor and non-salicide device formed thereon, wherein the conductive type of the first transistor is different from that of the second transistor;
    forming a buffer layer over the substrate;
    forming a tensile material layer over the buffer layer;
    thinning a portion of the tensile material layer over the second transistor;
    performing a spike annealing process while the thinned portion of the tensile material layer still remains over the second transistor;
    removing the tensile material layer to expose the buffer layer over the substrate;
    forming a patterned salicide blocking layer over the non-salicide device; and
    performing a salicide process for forming a salicide layer on a portion of the first transistor and the second transistor.

2. The method of claim 1, wherein the conductive type of the first transistor is N type and the conductive type of the second transistor is P type.

3. The method of claim 1, wherein, after the step for thinning the portion of the tensile material layer over the second transistor, the thickness of the portion of the tensile material layer over the second transistor is about 0~200 angstroms.

4. The method of claim 1, wherein the tensile material layer formed over the buffer layer before the step of thinning the portion of the tensile material layer over the second transistor has a thickness of about 300~1000 angstroms.

5. The method of claim 1, wherein the method for removing the tensile material layer includes a wet etching process.

6. The method of claim 1, wherein the temperature of the spike annealing process is about 1000~1200° C.

7. The method of claim 1, wherein the buffer layer is made of silicon oxide.

8. The method of claim 1, wherein the thickness of the buffer layer is about 50~100 angstroms.

9. The method of claim 1, wherein the tensile material layer is made of silicon nitride.

10. The method of claim 1, wherein the material of the patterned salicide blocking layer includes silicon oxide and silicon nitride.

11. A method for forming a semiconductor device, comprising:
    providing a substrate having an N-type transistor, a P-type transistor and a non-salicide device formed thereon;
    forming a liner oxide layer over the substrate;
    forming a silicon nitride layer over the liner oxide layer;
    forming a patterned mask layer over the silicon nitride layer to expose a portion of the silicon nitride layer over the P-type transistor;
    removing a portion of the exposed silicon nitride layer
    removing the patterned mask layer;
    performing a thermal process while the thickness of a portion of the silicon nitride layer over the P-type transistor is smaller than the thickness of a portion of the silicon nitride layer over the N-type transistor;
    performing a wet etching process to remove the silicon nitride layer so as to expose the liner oxide layer; forming a salicide blocking layer over the non-salicide device to expose the N-type transistor and the P-type transistor; and
    performing a salicide process for forming a salicide layer on a portion of the N-type transistor and the P-type transistor.

12. The method of claim 11, wherein the thickness of the silicon nitride layer before the step of removing the portion of the exposed silicon nitride layer is about 300 18 1000 angstroms.

13. The method of claim 11, wherein the thickness of the liner oxide layer is about 50~100 angstroms.

14. The method of claim 11, wherein the salicide blocking layer is made of silicon nitride.

15. The method of claim 11, wherein the salicide blocking layer is made of silicon oxide.

16. The method of claim 11, wherein the temperature of the thermal process is about 1000~1200° C.

17. The method of claim 11, wherein the thermal process includes a spike annealing process.

* * * * *